(12) United States Patent
Liang et al.

(10) Patent No.: US 8,203,321 B2
(45) Date of Patent: Jun. 19, 2012

(54) MULTI-FUNCTIONAL DRMOS

(75) Inventors: Nai-Yuan Liang, Taipei (TW); Isaac Y. Chen, Jubei (TW); Shao-Hung Lu, Taoyuan (TW)

(73) Assignee: Richtek Technology Corp., Hsinchu (TW)

( * ) Notice: Subject to any disclaimer, the term of this patent is extended or adjusted under 35 U.S.C. 154(b) by 413 days.

(21) Appl. No.: 12/461,106

(22) Filed: Jul. 31, 2009

(65) Prior Publication Data
US 2010/0033237 A1 Feb. 11, 2010

(30) Foreign Application Priority Data
Aug. 5, 2008 (TW) .................. 97129725 A

(51) Int. Cl.
*G05F 1/613* (2006.01)

(52) U.S. Cl. .......... 323/282; 323/272; 323/907
(58) Field of Classification Search ............ 323/272, 323/282, 907; 363/65, 71, 72
See application file for complete search history.

(56) References Cited

U.S. PATENT DOCUMENTS

| | | | |
|---|---|---|---|
| 7,262,628 B2 * | 8/2007 | Southwell et al. ............ 323/266 |
| 7,342,383 B1 * | 3/2008 | Song et al. ..................... 323/222 |
| 7,368,959 B1 * | 5/2008 | Xu et al. ........................ 327/141 |
| 2006/0022657 A1 * | 2/2006 | Sutardja et al. ............... 323/283 |
| 2006/0279350 A1 * | 12/2006 | Zhang et al. ................... 327/407 |
| 2008/0089101 A1 * | 4/2008 | Schuellein ....................... 363/65 |

* cited by examiner

*Primary Examiner* — Harry Behm
(74) *Attorney, Agent, or Firm* — Rosenberg, Klein & Lee

(57) ABSTRACT

A DrMOS combines a high side power MOSFET, a low side power MOSFET and a driver circuit for driving the power MOSFETs with current balance and thermal balance mechanism and variable phase control circuit on a single chip.

25 Claims, 9 Drawing Sheets

MULTI-FUNCTIONAL DRMOS

FIELD OF THE INVENTION

The present invention is related generally to power converters and, more particularly, to a DrMOS with current balance and thermal balance mechanism and variable phase control.

BACKGROUND OF THE INVENTION

For power converter applications, Intel Corporation proposed a DrMOS, driver and power MOS integration on a single chip, to reduce the parasitic effects between the driver circuit and power MOSFETs and thereby improve the converter efficiency.

SUMMARY OF THE INVENTION

An object of the present invention is to provide a novel DrMOS with current balance mechanism.

Another object of the present invention is to provide a novel DrMOS with thermal balance mechanism.

Yet another object of the present invention is to provide a novel DrMOS with variable phase control.

According to the present invention, a DrMOS comprises a high side power MOSFET coupled between a first voltage terminal and a phase node, a low side power MOSFET coupled between the phase node and a second voltage terminal, a driver circuit coupled to the high side and low side power MOSFETs to drive thereto in response to a control signal to thereby regulate an output current, and a balance control mechanism regulating the output current according to a difference between a current sense signal and a current balance signal from a first bus and a thermal balance signal from a second bus.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
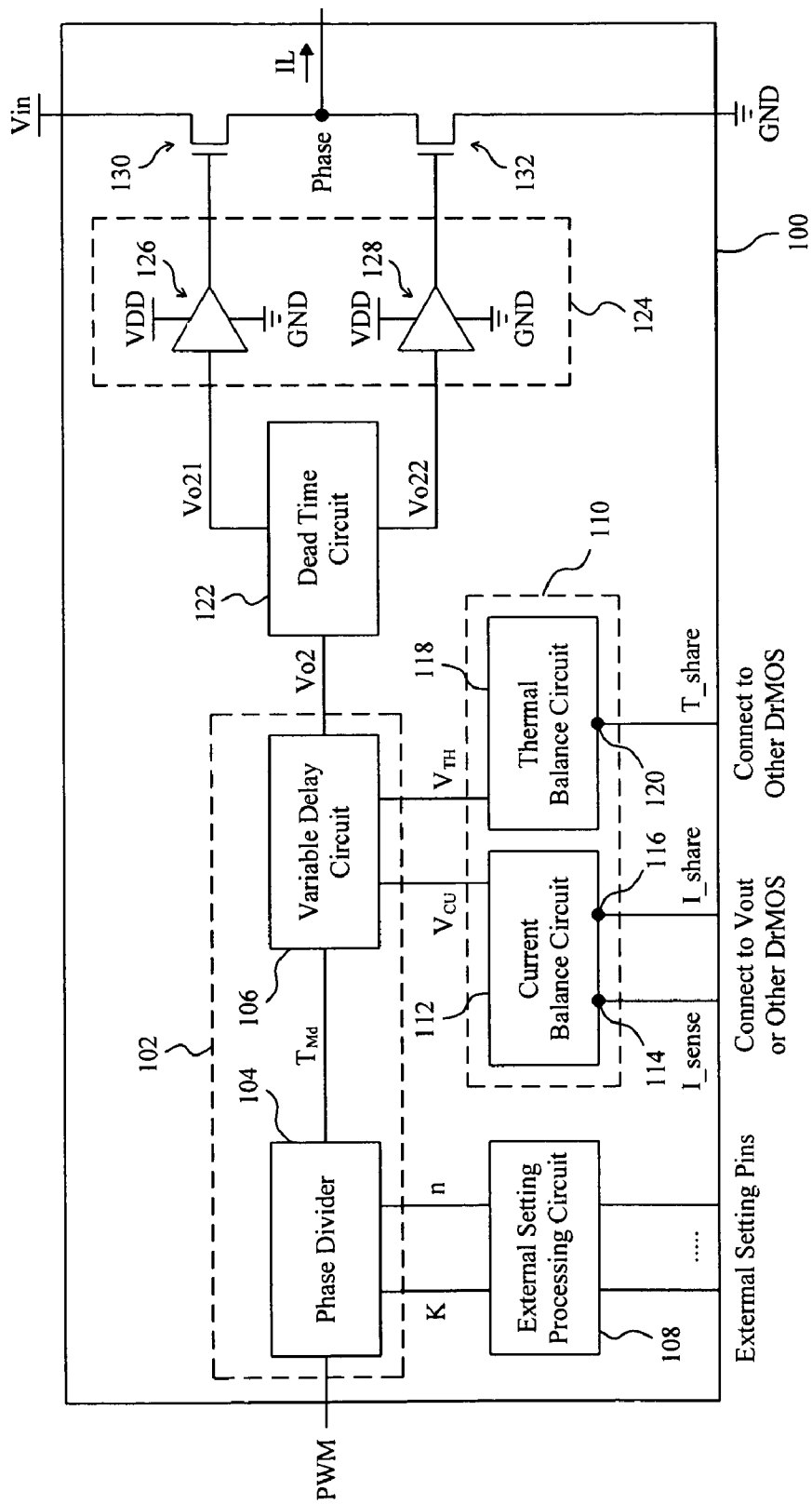
FIG. 1 is a block diagram of a first embodiment according to the present invention.
Figure 2:
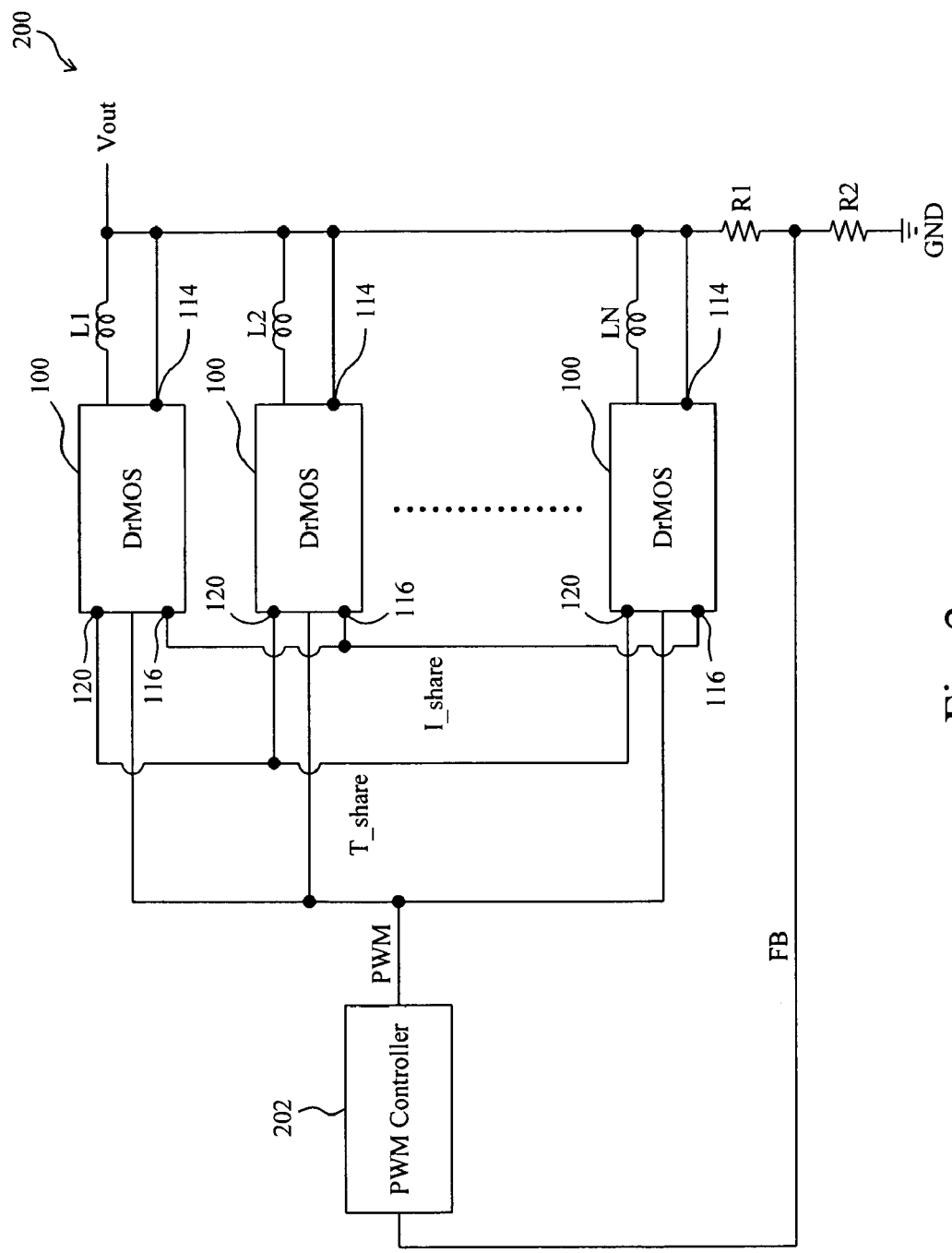
FIG. 2 is a system diagram of a multi-phase power converter using the DrMOS of FIG. 1.

FIG. 1 is a block diagram of a first embodiment according to the present invention, and FIG. 2 is a system diagram of a multi-phase power converter 200 using the DrMOS 100 of FIG. 1. In the DrMOS 100, a high side power MOSFET 130 is coupled between a first voltage terminal Vin and a phase node Phase, a low side power MOSFET 132 is coupled between the phase node Phase and a second voltage terminal GND, a driver circuit 124 is coupled to the high side and low side power MOSFETs 130 and 132 to drive thereto in response to a first control signal Vo2, an external setting processing circuit 108 controlled by an active or passive element or a signal bus provides a first information n and a second information K upon an external setting, where n and K represent the number n of the total DrMOSes 100 in the multi-phase power converter 200 and the order number K of the K-th DrMOS 100, a variable phase control circuit 102 including a phase divider 104 and a variable delay circuit 106 alters the phase of a second control signal PWM provided by a PWM controller 202 according to n and K to thereby generate the first control signal Vo2, the phase divider 104 includes a phase lock loop (PLL) or a delay lock loop (DLL) for phase division of the second control signal PWM into n different ones according to n and K and picking up one therefrom to be its output signal $T_{Md}$, the variable delay circuit 106 generates the first control signal Vo2 according to the signal $T_{Md}$ and modulation signals $V_{CU}$ and $V_{TH}$ provided by a balance control mechanism 110, and a dead time circuit 122 for preventing the power MOSFETs 130 and 132 from being turned on simultaneously generates control signals Vo21 and Vo22 according to the first control signal Vo2 for drivers 126 and 128 in the driver circuit 124 to drive the power MOSFETs 130 and 132, respectively, to thereby provide an output voltage Vout and an output current IL. The balance control mechanism 110 includes a current balance circuit 112 and a thermal balance circuit 118. The current balance circuit 112 has a current sense terminal 114 to receive a current sense signal related to the output current IL and a current balance terminal 116 connected to the current balance terminals of the other DrMOSes 100 through a first bus I_share as shown in FIG. 2, and generates the current modulation signal $V_{CU}$ upon the current sense signal and the current balance signal from the current balance terminal 116 for the variable delay circuit 106 to modulate the duty of the first control signal Vo2 to thereby regulate the output current IL. The thermal balance circuit 118 has a thermal balance terminal 120 connected the thermal balance terminals of the other DrMOSes 100 through a second bus T_share as shown in FIG. 2, and generates the thermal modulation signal $V_{TH}$ upon a thermal balance signal from the thermal balance terminal 120 and the detected temperature of the DrMOS 100 for the variable delay circuit 106 to modulate the duty of the first control signal Vo2 to thereby regulate the output current IL.

Figure 3:
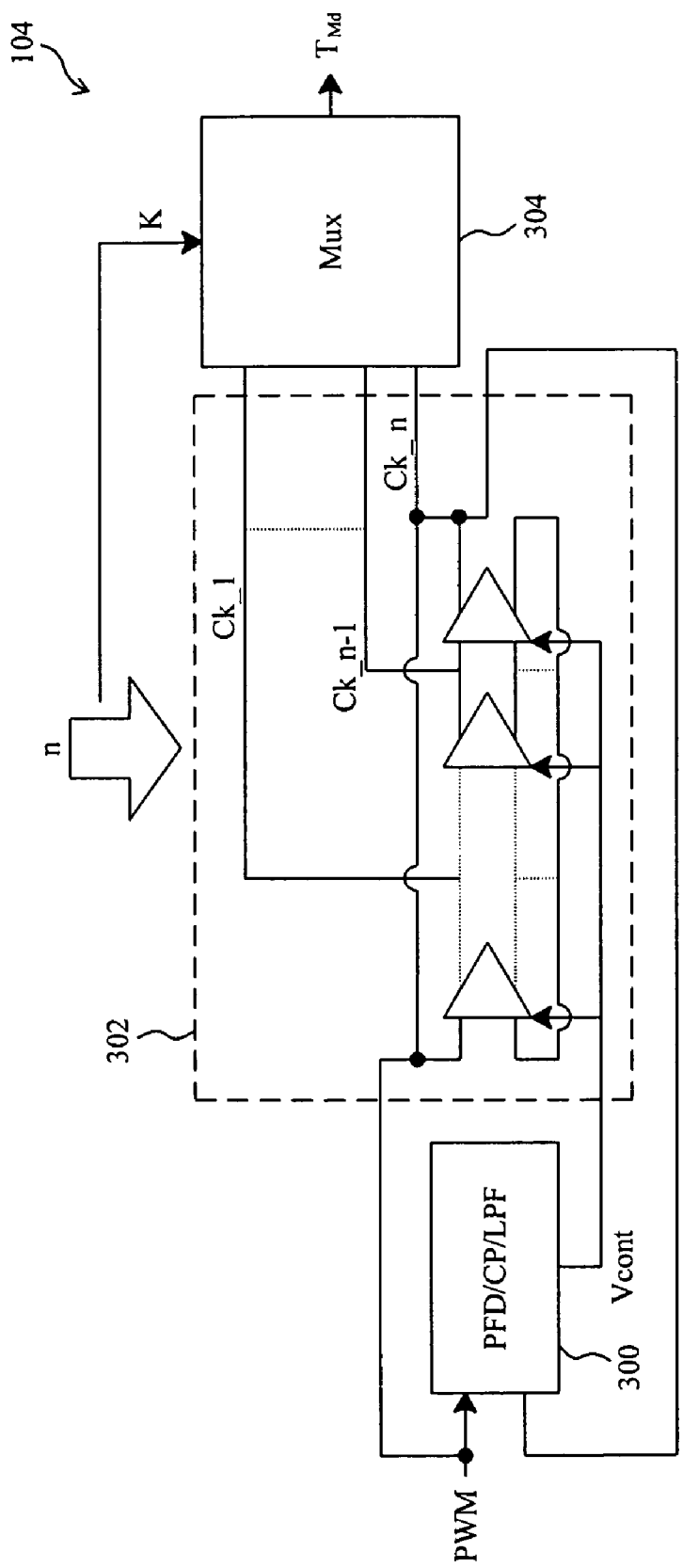
FIG. 3 is a circuit diagram of an embodiment for the phase divider shown in FIG. 1.
Figure 4:
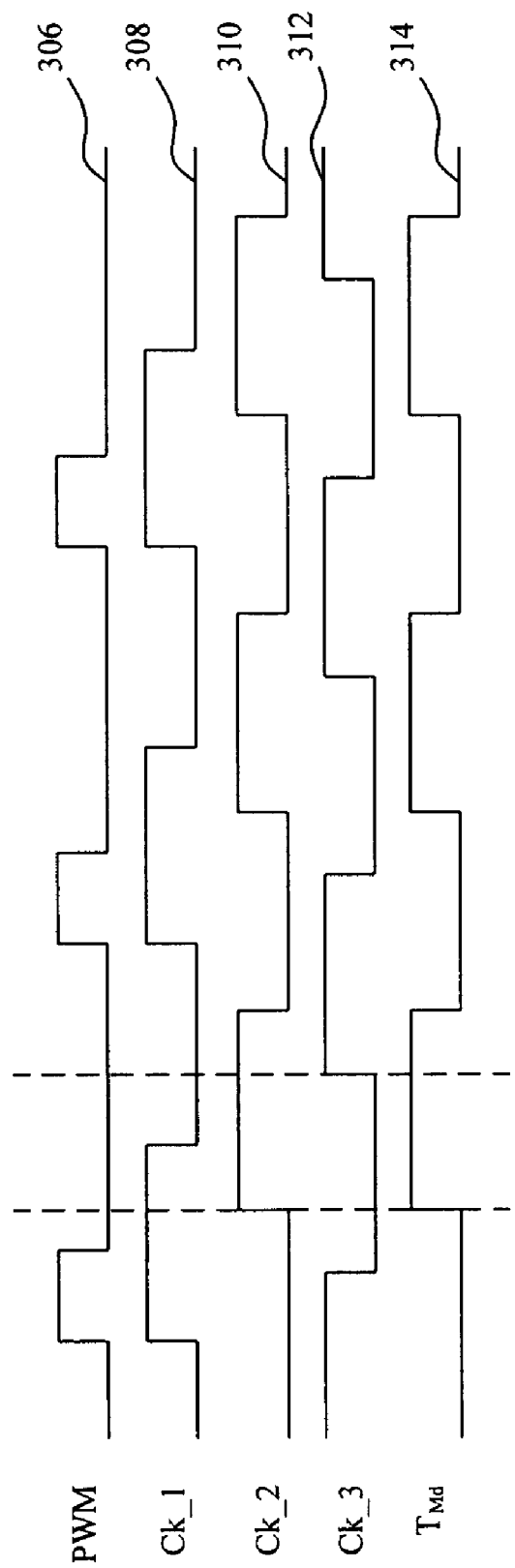
FIG. 4 is a waveform diagram of the phase divider shown in FIG. 3.

FIG. 3 is a circuit diagram of an embodiment for the phase divider 104, and FIG. 4 is a waveform diagram thereof. Referring to FIG. 3, in the phase divider 104, a lock loop including a control circuit 300 and a voltage controlled delay line (VCDL) 302 may be a PLL or a DLL, the control circuit 300 has a phase frequency detector (PFD), a charge pump (CP) and a low pass filter (LPF), and generates a delay control signal Vcont according to the second control signal PWM, the VCDL 302 divides the second control signal PWM into signals Ck_1, . . . , Ck_n−1, and Ck_n of n different phases according to the delay control signal Vcont and the first information n, and according to the second information K, a multiplexer 304 selects one from the signals Ck_1, . . . , Ck_n−1, and Ck_n to be the output signal $T_{Md}$. Referring to FIG. 4, assuming that n=3 and K=2 for easy for description, the lock loop divides the second control signal PWM into three signals Ck_1, Ck_2 and Ck_3 of three different phases as shown by the waveforms 306, 308, 310 and 312, and the multiplexer 304 selects the second signal Ck_2 as the output signal $T_{Md}$ as shown by the waveform 314.

Figure 5:
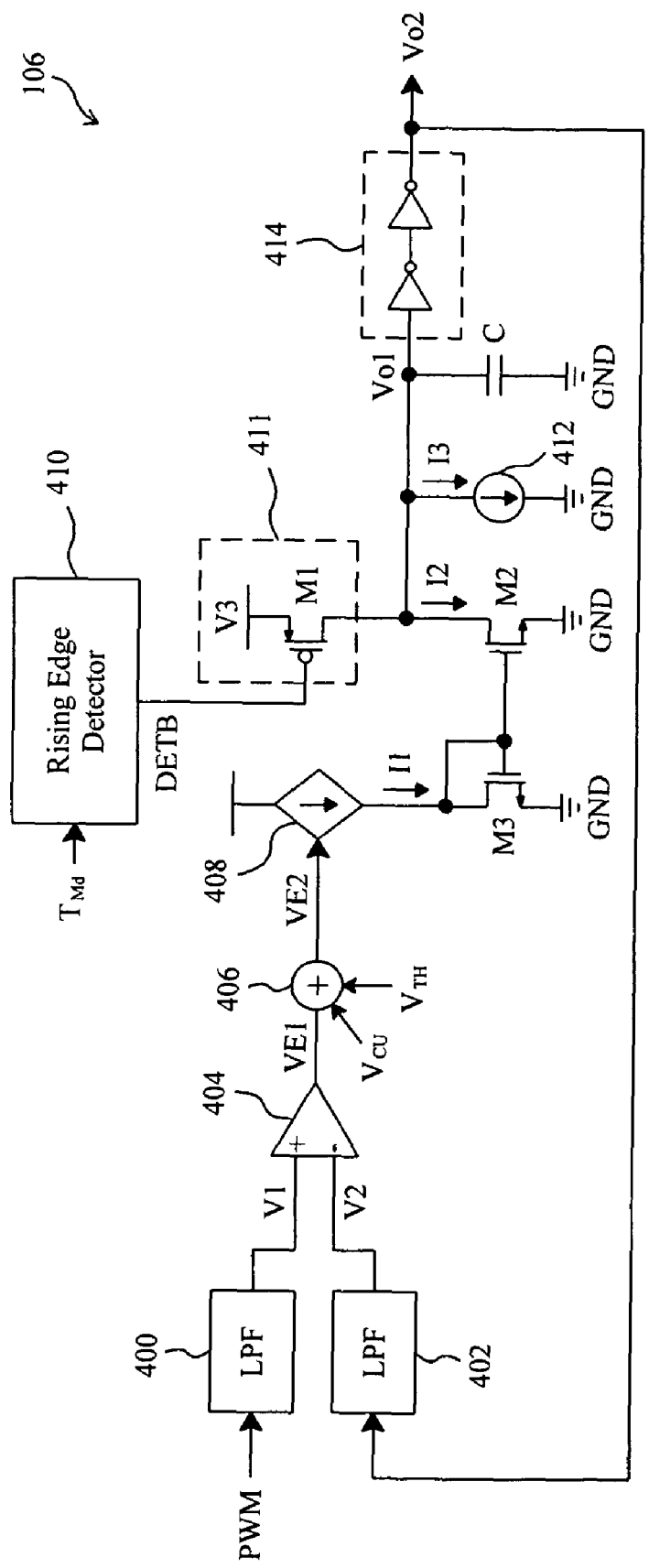
FIG. 5 is a circuit diagram of an embodiment for the variable delay circuit shown in FIG. 1.
Figure 6:
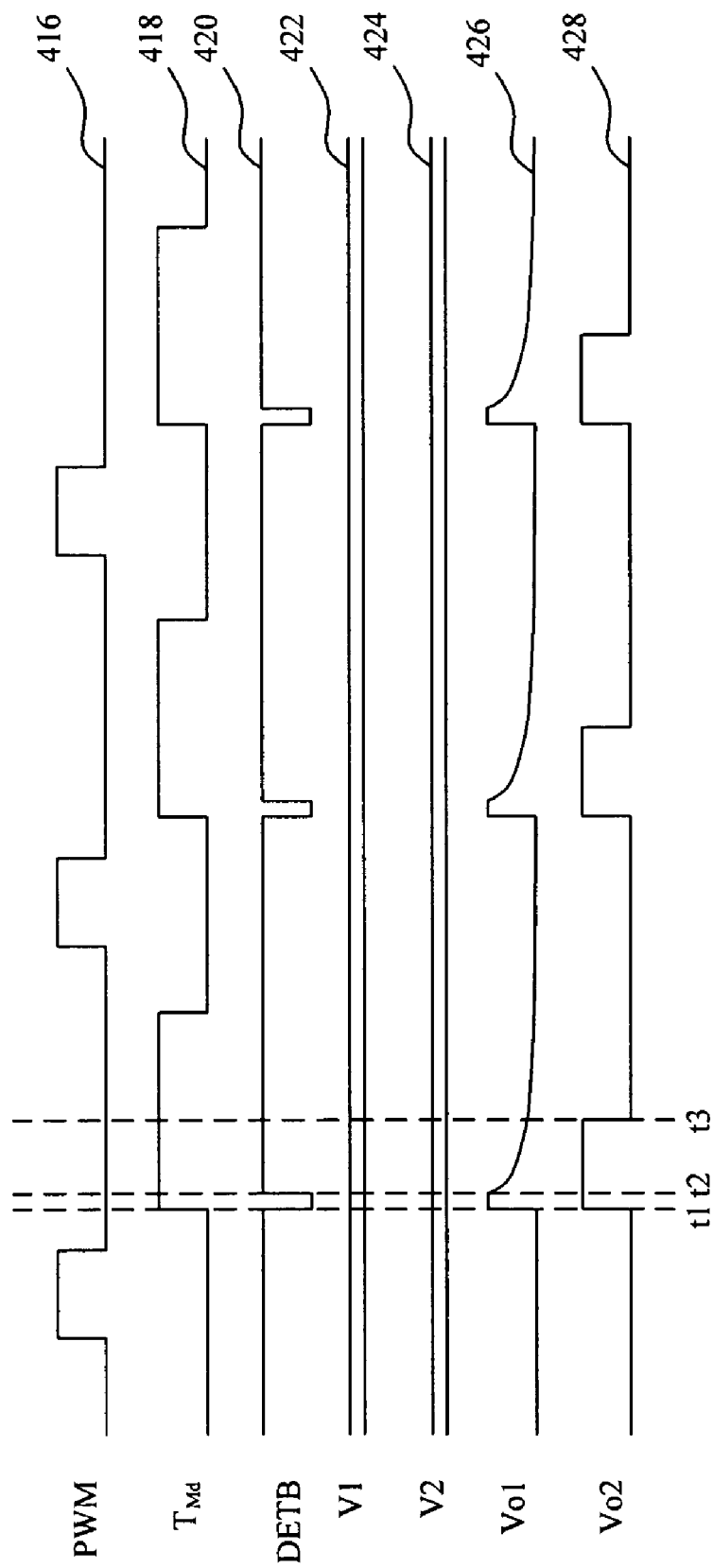
FIG. 6 is a waveform diagram of the variable delay circuit shown in FIG. 5.

FIG. 5 is a circuit diagram of an embodiment for the variable delay circuit 106, and FIG. 6 is a waveform diagram thereof. In the variable delay circuit 106 shown in FIG. 5, a low pass filter 400 filters the second control signal PWM to generate a signal V1 as shown by the waveforms 416 and 422, another low pass filter 402 filters the first control signal Vo2 fed back from the output of the variable delay circuit 106 to generate a signal V2 as shown by the waveforms 428 and 424, an error amplifier 404 compares the signals V1 and V2 to generate an error signal VE1, an adder 406 combines the error signal VE1, the current modulation signal $V_{CU}$ provided by the current balance circuit 112, and the thermal modulation signal $V_{TH}$ provided by the thermal balance circuit 118 to generate a signal VE2, a voltage controlled current source 408 generates a current I1 according to the signal VE2, a current mirror constructed by transistors M2 and M3 mirrors the current I1 to generate a current I2, a rising edge detector 410 detects the rising edge of the signal $T_{Md}$ to trigger a signal DETB to control a current source 411, when the signal $T_{Md}$ transits from low to high as shown by the waveform 418 at time t1, the signal DETB is triggered as shown by the waveform 420 to turn on a PMOS transistor M1, consequently the current source 411 charges a capacitor C to raise the voltage Vo1 thereon, when the voltage Vo1 becomes higher than the threshold voltage of a logic circuit 414, the logic circuit 414 triggers the first control signal Vo2 as shown by the waveform 428, after the signal DETB terminates as shown at time t2, the PMOS transistor M1 turns off and the capacitor C is discharged by the current I2 and a current I3 determined by another current source 412, as a result the voltage Vo1 starts to decrease as shown by the waveform 426, and when the voltage Vo1 becomes lower than the threshold voltage of the logic circuit 414 as shown at time t3, the first control signal Vo2 terminates. Since the current I3 is constant, the duty of the first control signal Vo2 depends on the current I2. The lower the current I2 is, the slower the capacitor C is discharged, and the longer the duty of the first control signal Vo2 will be. On the contrary, the higher the current I2 is, the faster the capacitor C is discharged, and the shorter the duty of the first control signal Vo2 will be. Since the current I2 varies with the signal VE2, the duty of the first control signal Vo2 can be adjusted by altering the signal VE2.

Figure 7:
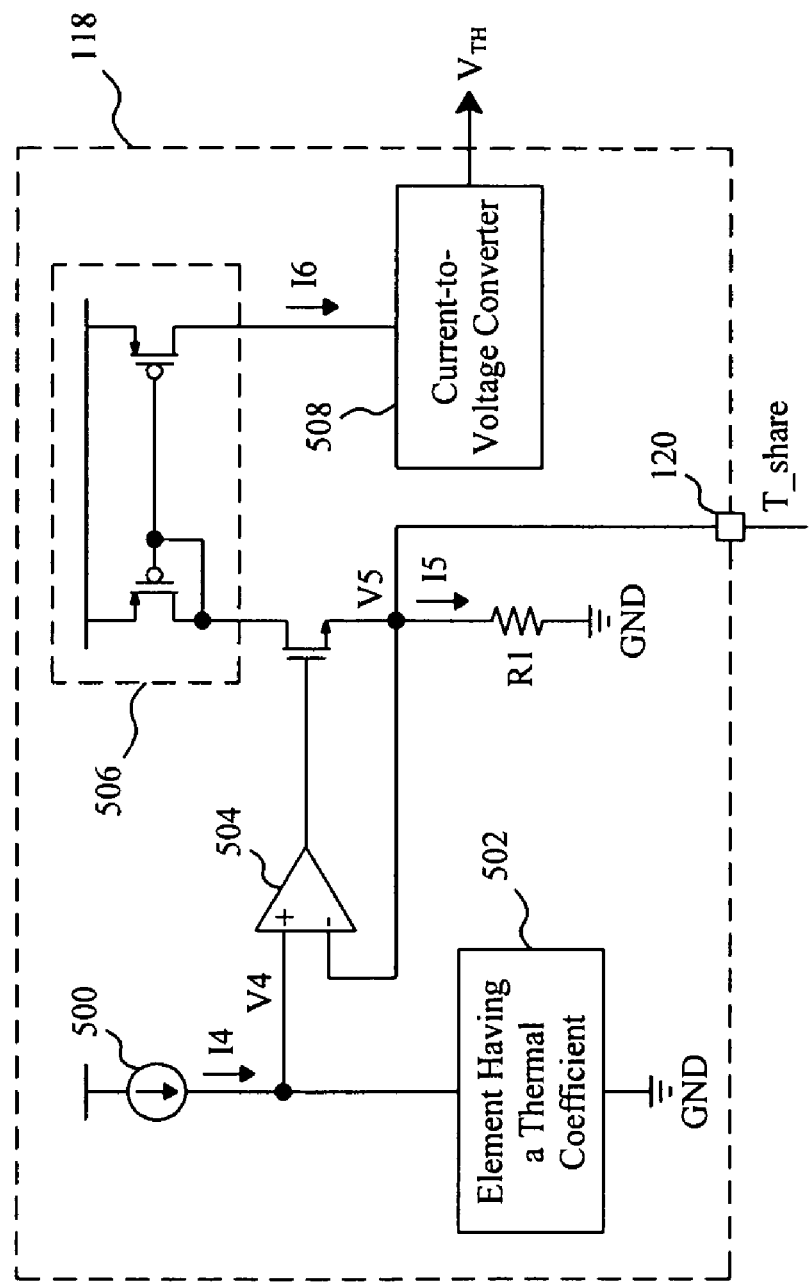
FIG. 7 is a circuit diagram of an embodiment for the thermal balance circuit shown in FIG. 1.

FIG. 7 is a circuit diagram of an embodiment for the thermal balance circuit 118, in which a current source 500 provides a temperature independent current I4 for an element 502 having a temperature coefficient to generate a voltage V4. The characteristic of the element 502 varies with the temperature of the DrMOS 100, and therefore the voltage V4 varies with the temperature of the DrMOS 100, too. An operational amplifier 504 applies the voltage V4 to the thermal balance terminal 120, and a resistor R1 is connected in parallel with the resistors R1 in the other DrMOSes 100 through the thermal balance terminal 120 and the second bus T_share. Consequently, all the voltages V4 applied to the thermal balance terminals 120 by the thermal balance circuits 118 in the whole system are automatically averaged and provide an average voltage V5 at the thermal balance terminals 120, and thus the resistor R1 receives a current I5 in proportion to the average voltage V5. A current mirror 506 mirrors the current I5 to generate a current I6 which is converted into the thermal modulation $V_{TH}$ by a current-to-voltage converter 508 to regulate the output current IL and in turn regulate the temperature of the DrMOS 100 to an average of all the DrMOSes' temperatures.

Figure 8:
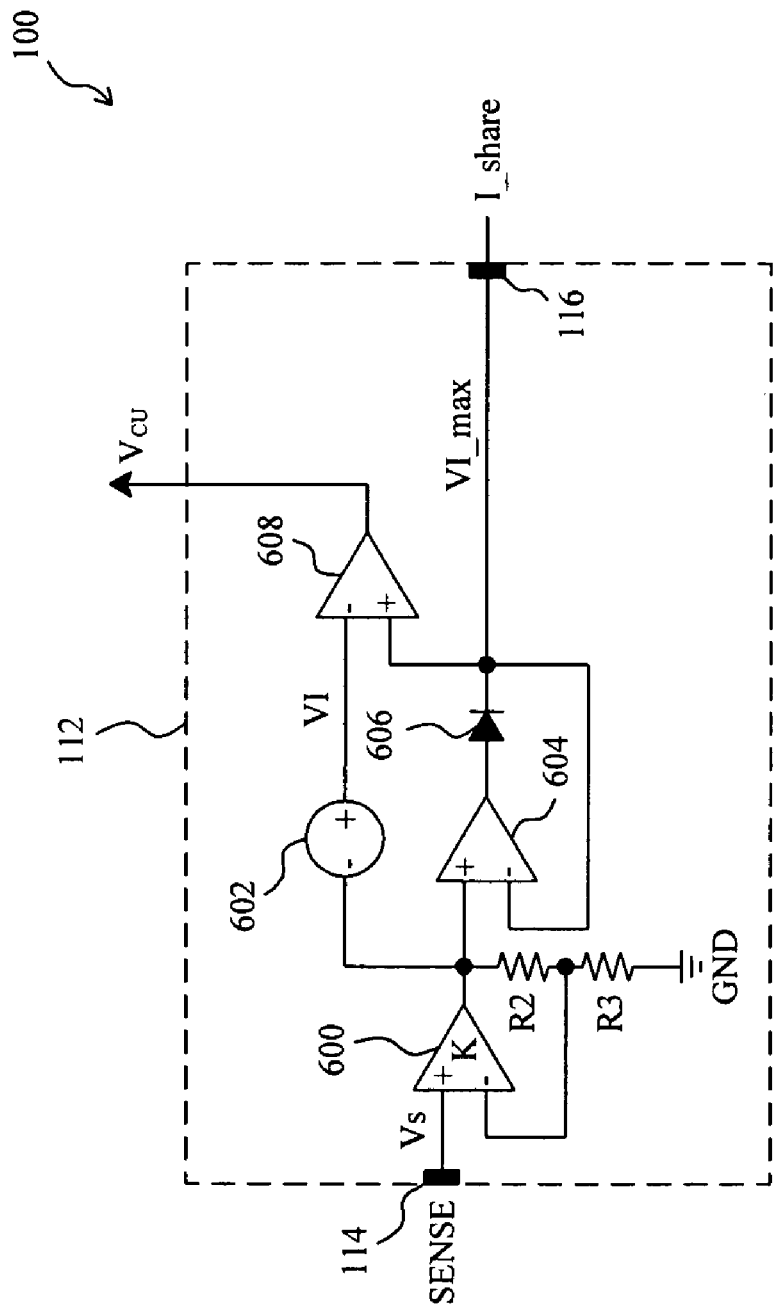
FIG. 8 is a circuit diagram of an embodiment for the current balance circuit shown in FIG. 1.

FIG. 8 is a circuit diagram of an embodiment for the current balance circuit 112, in which the current sense terminal 114 receives a current sense signal Vs related to the output current IL to be amplified by a gain stage 600 and further biased by a bias voltage source 602 to produce a voltage VI, and an operational amplifier 604 is configured as a voltage follower to apply the voltage VI to the current balance terminal 116. Since the current balance terminals 116 of all the DrMOSes 100 are connected together by the first bus I_share as shown in FIG. 2, the maximum one VI_max among the voltages VI of all the DrMOSes 100 will be present at the current balance terminal 116. A diode 606 is inserted between the output of the operational amplifier 604 and the current balance terminal 116 to prevent reverse current from the current balance terminal 116 to the output of the operational amplifier 604. A comparator 608 compares the voltages VI and VI_max to generate the current modulation signal $V_{CU}$. Since the voltage VI is related to the output current IL and the voltage VI_max is related to the maximum one IL_max among the output currents IL of all the DrMOSes 100, the comparison between the voltages VI and VI_max can be considered as one between the output current IL and the maximum output current IL_max. Therefore, the output of the comparator 608 can regulate the output current IL to the maximum output current IL_max, and thereby balance the output currents IL of all the DrMOSes 100.

Figure 9:
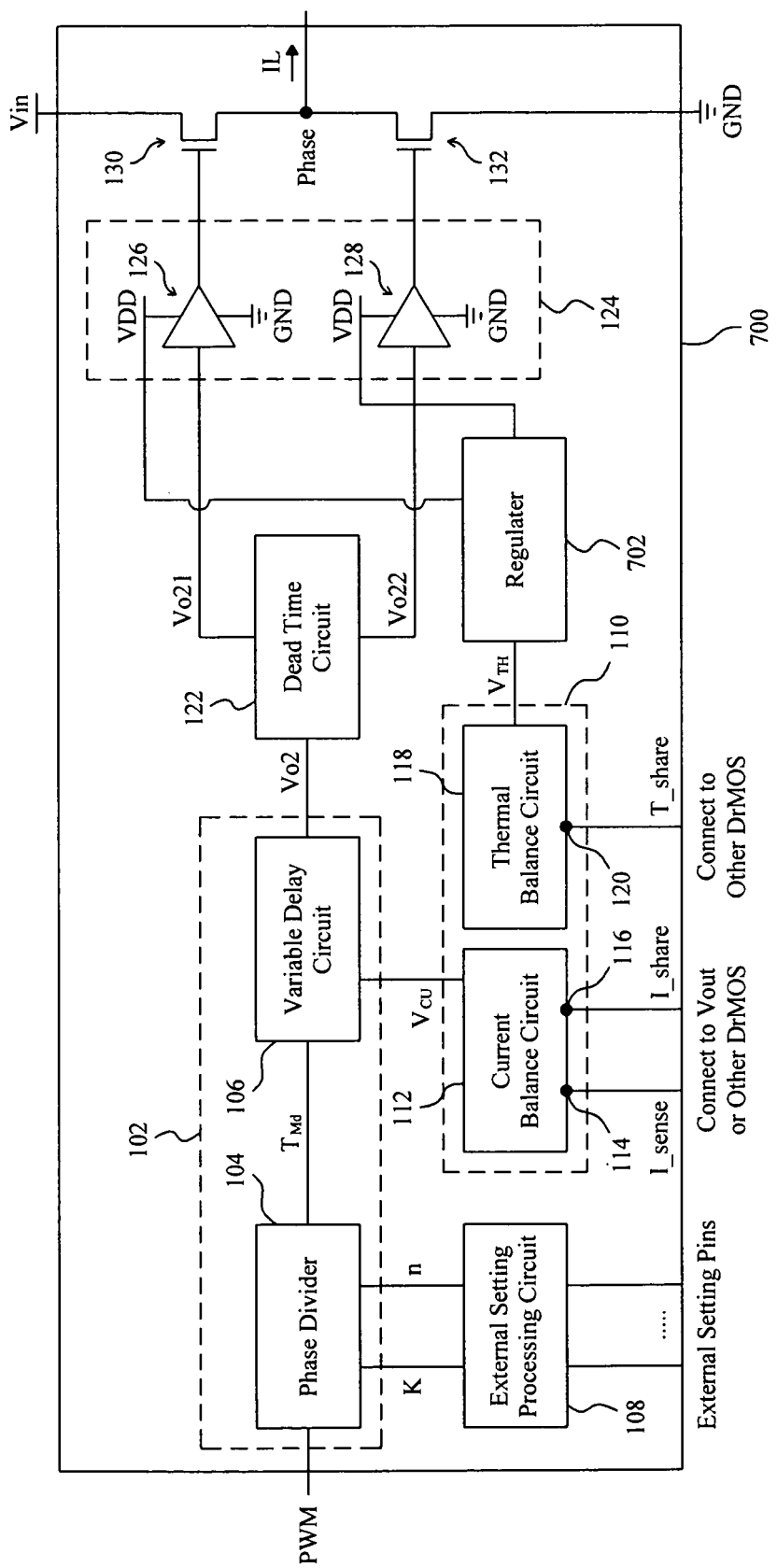
FIG. 9 is a block diagram of a second embodiment according to the present invention.

FIG. 9 is a block diagram of a second embodiment according to the present invention, in which, in addition to the phase divider 104, variable delay circuit 106, external setting processing circuit 108, current balance circuit 112, thermal balance circuit 118, dead time circuit 122, driver circuit 124, and high side and low side power MOSFETs 130 and 132 as shown in FIG. 1, the DrMOS 700 in this embodiment further includes a regulator 702 to change the power rail VDD in the driver circuit 124 according to the thermal modulation signal $V_{TH}$. When the power MOSFETs 130 and 132 operates in their linear regions, they has the on-resistance $$Ron \propto \frac{1}{Vgs - Vth}, \qquad [\text{Eq-1}]$$

where Vgs is the voltage difference between the gate and source of the power MOSFET and Vth is the threshold voltage of the power MOSFET. As shown by the equation Eq-1, when the voltage Vgs increases, the on-resistance Ron decreases, and when the voltage Vgs decreases, the on-resistance Ron increases. Moreover, since the power rail VDD determines the maximum voltage of the output signals of the drivers 126 and 128, the higher the power rail VDD is, the higher the voltage Vgs is, and vice versa. With the variation of the on-resistances Ron, the output current IL varies accordingly. Hence, by use of the regulator 702 to change the power rail VDD in the driver circuit 124 according to the thermal modulation signal $V_{TH}$, the output current IL is regulated and in turn the temperature of the DrMOS 700 is regulated.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A DrMOS, comprising:
a high side power MOSFET coupled between a first voltage terminal and a phase node;
a low side power MOSFET coupled between the phase node and a second voltage terminal;
a driver circuit coupled to the high side and low side power MOSFETs to drive thereto in response to a control signal to thereby provide an output current, and
a thermal balance circuit monitoring a temperature of the DrMOS to modulate the control signal to thereby regulate the output current;
wherein the thermal balance circuit comprises:
a thermal balance terminal;
an element having a characteristic varying with the temperature of the DrMOS;
a current source providing a first current for the element to generate a variable voltage varying with the temperature of the DrMOS to apply to the thermal balance terminal;
a resistor coupled to the thermal balance terminal to receive a second current according to a voltage at the thermal balance terminal; and
a current-to-voltage converter converting a third current related to the second current into a thermal modulation signal to regulate the output current.

2. The DrMOS of claim 1, wherein the thermal balance circuit further comprises a current mirror mirroring the second current to provide the third current.

3. The DrMOS of claim 1, wherein the thermal modulation signal modulates a duty of the control signal.

4. The DrMOS of claim 1, wherein the thermal modulation signal modulates on-resistances of the high side and low side power MOSFETs.

5. The DrMOS of claim 4, wherein the thermal modulation signal changes a power rail of the driver circuit to modulate the on-resistances of the high side and low side power MOSFETs.

6. The DrMOS of claim 1, further comprising a current balance circuit sensing the output current and providing a current modulation signal for regulating the output current.

7. The DrMOS of claim 6, wherein the current balance circuit comprises:
a current balance terminal; and
an amplifier circuit generating the current modulation signal according to a current sense signal related to the output current and a current balance signal at the current balance terminal.

8. The DrMOS of claim 7, wherein the current sense signal is generated by detecting a voltage at the phase node.

9. The DrMOS of claim 7, wherein the current sense signal is generated by detecting a current in the high side power MOSFET or the low side power MOSFET.

10. A DrMOS, comprising:
a high side power MOSFET coupled between a first voltage terminal and a phase node;
a low side power MOSFET coupled between the phase node and a second voltage terminal;
a driver circuit coupled to the high side and low side power MOSFETs to drive thereto in response to a first control signal to thereby provide an output current;
a phase divider dividing a second control signal into signals of a plurality of different phases, and selecting one therefrom to be an output signal; and
a variable delay circuit coupled to the phase divider, generating the first control signal according to the output signal, the variable delay circuit comprising:
a capacitor;
a first current source coupled to the capacitor;
an edge detector coupled to the first current source, detecting an edge of the output signal of the phase divider to drive the first current source to provide a current to charge the capacitor;
a second current source coupled to the capacitor, controlling a discharging speed of the capacitor; and
a logic circuit coupled to the capacitor, generating the first control signal according to a threshold voltage thereof and a voltage at the capacitor.

11. The DrMOS of claim 10, wherein the phase divider comprises:
a lock loop equally dividing the phase of the second control signal to thereby produce the signals of the plurality of different phases according to a first information; and
a multiplexer coupled to the lock loop, selecting the one from the signals of the plurality of phases according to a second information.

12. The DrMOS of claim 11, wherein the lock loop comprises a phase lock loop.

13. The DrMOS of claim 11, wherein the lock loop comprises a delay lock loop.

14. The DrMOS of claim 10, wherein the second current source provides a current varying with the first and second control signals.

15. The DrMOS of claim 10, further comprising a balance control mechanism regulating the output current.

16. The DrMOS of claim 15, wherein the balance control mechanism comprises a thermal balance circuit sensing a temperature of the DrMOS to regulate the output current.

17. The DrMOS of claim 16, wherein the thermal balance circuit comprises:
a thermal balance terminal;
an element having a characteristic varying with the temperature of the DrMOS;
a third current source providing a second current for the element to generate a variable voltage varying with the temperature of the DrMOS to apply to the thermal balance terminal;
a resistor coupled to the thermal balance terminal to receive a third current according to a voltage at the thermal balance terminal; and
a current-to-voltage converter converting a fourth current related to the third current into a thermal modulation signal to regulate the output current.

18. The DrMOS of claim 17, further comprising a current mirror mirroring the third current to provide the fourth current.

19. The DrMOS of claim 17, wherein the thermal modulation signal modulates a duty of the first control signal.

20. The DrMOS of claim 17, wherein the thermal modulation signal modulates on-resistances of the high side and low side power MOSFETs.

21. The DrMOS of claim 20, wherein the thermal modulation signal changes a power rail of the driver circuit to modulate the on-resistances of the high side and low side power MOSFETs.

22. The DrMOS of claim 15, wherein the balance control mechanism comprises a current balance circuit sensing the output current and providing a current modulation signal for regulating the output current.

23. The DrMOS of claim 22, wherein the current balance circuit comprises:
    a current balance terminal; and
    an amplifier circuit generating the current modulation signal according to a current sense signal related to the output current and a current balance signal at the current balance terminal.

24. The DrMOS of claim 23, wherein the current sense signal is generated by detecting a voltage at the phase node.

25. The DrMOS of claim 23, wherein the current sense signal is generated by detecting a current in the high side power MOSFET or the low side power MOSFET.

* * * * *